(12) United States Patent
Krenzke

(10) Patent No.: US 6,784,708 B1
(45) Date of Patent: Aug. 31, 2004

(54) SLEW RATE SENSING AND CONTROL OF A HIGH-VOLTAGE OUTPUT DRIVER FOR A VARIABLE VOLTAGE RANGE AND VARIABLE OUTPUT LOAD

(75) Inventor: Rainer Krenzke, Esslingen (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 10/615,123

(22) Filed: Jul. 8, 2003

(30) Foreign Application Priority Data

Jun. 27, 2003 (EP) ............................................. 03392009

(51) Int. Cl.[7] .............................................. H03K 5/12
(52) U.S. Cl. ...................................... 327/170; 327/108
(58) Field of Search .......................... 327/103, 108–112, 327/132, 134, 170, 379; 326/26–27, 31, 82–87

(56) References Cited

U.S. PATENT DOCUMENTS

| | | | |
|---|---|---|---|
| 5,254,883 A | 10/1993 | Horowitz et al. ............ | 307/443 |
| 6,009,487 A | 12/1999 | Davis et al. ................ | 710/105 |
| 6,181,193 B1 | 1/2001 | Coughlin, Jr. .............. | 327/534 |
| 6,194,935 B1 * | 2/2001 | Pioppo et al. .............. | 327/170 |
| 6,201,417 B1 | 3/2001 | Blum et al. ................ | 327/14 |
| 6,288,563 B1 | 9/2001 | Muljono et al. ............. | 326/27 |
| 6,476,654 B2 * | 11/2002 | Tanaka ..................... | 327/170 |
| 6,483,386 B1 | 11/2002 | Cress et al. ................ | 330/298 |
| 6,501,292 B1 * | 12/2002 | Nack ....................... | 326/27 |
| 6,683,482 B2 * | 1/2004 | Humphrey et al. .......... | 327/170 |
| 2002/0063590 A1 | 5/2002 | Nanba et al. ............... | 327/170 |

FOREIGN PATENT DOCUMENTS

WO  WO 99/10982  3/1999  ....... H03K/19/0175

OTHER PUBLICATIONS

DS–02–020 to Rainer Krenzke, Ser. No. 10/614,663, Filed Jul. 7, 2003, "Comparator with High–Voltage Inputs in an Extended CMOS Process for Higher Voltage Levels".

* cited by examiner

Primary Examiner—My-Trang Nu Ton
(74) Attorney, Agent, or Firm—George O. Saile; Stephen B. Ackerman

(57) ABSTRACT

A circuit and method are given, to realize a high voltage output driver within a closed regulator loop with slew rate control, insensitive against supply voltage variations. The high-voltage front-end, essentially a slope detector, is implemented as a combination of a voltage-current with a current-voltage transformer circuit, where only very few parts are working in the high voltage domain. Using the intrinsic advantages of that solution the circuit of the invention is manufactured with standard CMOS technology and only two discrete or integrated extended drain MOS components at low cost.

31 Claims, 4 Drawing Sheets

SLEW RATE SENSING AND CONTROL OF A HIGH-VOLTAGE OUTPUT DRIVER FOR A VARIABLE VOLTAGE RANGE AND VARIABLE OUTPUT LOAD

RELATED PATENT APPLICATION

This application is related to U.S. patent application Ser. No. 10/614,663, filed on Jul. 7, 2003, and assigned to the same assignee as the present invention.

BACKGROUND OF THE INVENTION

1. Field of the Invention

The invention relates generally to higher voltage output drivers of electronic circuits and in particular to slew rate controlled driver circuits within regulator loops realized with integrated-circuit technologies.

2. Description of the Prior Art

Special output driver circuits in electronic applications are required, when it comes to driving heavier loads, e.g. electromechanical devices such as relays, small motors (AC, DC, or stepping), or other types of sensors and actuators. Another application area is the driving of signals in data bus systems, especially when higher signal voltages on those bus systems are required e.g. when noisier electrical environments have to be taken into account. In this context a reduction of Electromagnetic Interference (EMI) phenomena is important too. These are noted quite common requirements for electronic parts as used in the automotive industry, for example.

Realizations of the prior art for such output driver circuits are often implemented as specifically tailored semiconductor circuits, fulfilling the operational demands regarding the higher voltages and augmented currents needed. Furthermore these drivers have to be interconnected with some logic circuitry, which is controlling the overall operation of the driver circuits, mostly in conjunction with closed loop feedback regulator systems. These logic circuits or even microprocessor systems normally are working with low voltages. The composition of these two voltage domains—one for higher, the other for lower voltages—has to be made in such a way, that no detrimental influences are affecting onto each other. Thereto an appropriately combined semiconductor technology capable of handling all these demands is chosen, which most often leads to costly solutions.

Another problem to solve concerning these driver circuits is the sensing and control of the slew rate of the generated signals within the regulator loop. The governing reference is the value of the slew rate, which is generated as an internal reference ramp. This reference ramp is usually generated between the rails of the external output range. In consequence the regulator is fed with the reference ramp for the value required and the driver output signal as the instantaneous signal value. This conception however requires the whole circuit to operate within the high-voltage domain and needs therefore high-voltage drivers and regulator circuits.

It is a challenge for the designer of such circuits to achieve a high-quality, low-cost solution. Several prior art inventions referring to such solutions describe related technologies, methods and circuits.

U. S. Pat. No. (6,181,193 to Coughlin, Jr.) describes using thick-oxide CMOS devices to interface high voltage integrated circuits, especially a high voltage tolerant CMOS input/output interface circuit. In this circuit, a process feature called "dual-gate" or "thick-oxide" process is used on any devices that will be exposed to high voltage. The thick-oxide devices have a larger capacitance and lower bandwidth, and therefore, preferably, they are only used where exposure to high voltage can cause damage. The remaining devices on the interface circuit may all use a standard process with the thinner oxide, allowing the I/O and the core IC to run at maximum speed. The circuit design topology also limits the number of devices that are exposed to high voltage. Preferably, the protection scheme is broken down into two parts: the driver and receiver.

U.S. Pat. No. (6,201,417 to Blum et al.) discloses the shaping of a current sense signal by using a controlled slew rate, a method and circuit for reducing the leading edge spike in a current sense signal. The current sense signal is a measure of the current through a switched power device controlled by a switching regulator controller. The slew rate of the current sense signal is limited to prevent the slew rate from exceeding a predetermined maximum. The limited slew rate signal is provided to the switching regulator controller. A transconductance amplifier may be used to limit the slew rate of the current sense signal. A capacitor at the output of the transconductance amplifier contributes to controlling the maximum slew rate of the amplifier. The capacitor is charged by the current output of the amplifier to provide a voltage signal for use in place of the original current sense signal. A switch may be provided for selecting between the slew rate limited current sense signal and the original current sense signal. A time delay may be used to control the switch so that the slew rate limiting is replaced by the original current sense signal after a first predetermined time portion of each "on cycle" of the switched power device.

U.S. Pat. No. (6,476,654 to Tanaka) shows a slew rate adjusting circuit. An interface circuit includes a slew rate control unit, a pre buffer unit, and a main buffer unit. The slew rate control unit is configured as a current source circuit of the pre buffer unit. The slew rate control unit provides a constant current value by using a loop circuit that consists of a slew rate control macro, a decoder, a comparator, N transistor, an external terminal resistance (Rref), and a reference voltage (Vref). A size of the N transistor is adjusted based on a code gradually changed in the loop circuit, and finally the current value is determined uniquely.

U.S. Pat. No. 6,483,386 (to Cress, et al.) discloses a low voltage differential amplifier with high voltage protection. An apparatus comprising a native device coupled to an input of an amplifier. The native device is configured to provide a high voltage protection in response to an enable signal.

SUMMARY OF THE INVENTION

A principal object of the present invention is to provide an effective and very manufacturable method and circuit for a slew rate controlled driving of loads for higher voltages and currents.

Another further object of the present invention is to attain a secure cooperation of circuits working in different voltage domains—a high and a low one.

Another main object of this invention is to reduce EMI phenomena as much as possible, e.g. by slope smoothing.

Also an object of this invention is to transfer the slope destination of the slew rate controlled signal from the high-voltage domain to the low-voltage domain.

Another object of this invention is to avoid the need for destination of absolute signal values by using a differential method for the slope detection.

Another still further object of the present invention is to reach a stable behavior of the regulator circuit, i.e. to attain an unconditional stability of the regulator loop.

A still further object of the present invention is to reduce the power consumption of the circuit by realizing inherent appropriate design features.

Another further object of the present invention is to reduce the cost of manufacturing by implementing the circuit as a monolithic integrated circuit in low cost CMOS technology.

Another still further object of the present invention is to reduce cost by effectively minimizing the number of expensive components.

In accordance with the objects of this invention, a method for realizing a stable high-voltage front-end for an output driver circuit, insensitive against supply voltage variations is given. Said method includes providing a slope transformer circuit, a differentiator with clock, a regulator consisting of a comparator with clock and a digital regulator part, and further a digital-to-analog converter. The method also comprises providing an output driver circuit driving an external load. Also included in said method is transforming a high-voltage input signal in relation to a static high supply voltage level into a proportional current signal, then mirroring this current signal and transforming back linearly into a voltage signal within a low voltage domain as proportional output signal. Equally included in said method is performing a differentiation transaction upon said low voltage output signal, in relation to given time steps from a clock generator. Also incorporated within said method is converting a low voltage differentiated output signal into a digital bit-signal by using a comparator, feeding said bit-signal into a digital regulator part. The comparator together with said digital regulator part builds a regulator. Said comparator is clocked and compares a reference input signal with said differentiated output signal. The comparator can be either a single-output comparator which then generates a bit stream output and uses a single reference value for comparison or a window comparator which then generates bit-outputs corresponding to the reference windows. Said bit outputs of said comparator are fed as input into the digital regulator part which generates an output signal. Finally comprises said method feeding said output signal from said digital regulator as input to a digital-to-analog converter and further the output of the analog-to-digital-converter as input to the output driver circuit, closing a regulator loop with said output signal from an output driver by feeding it back into said high voltage input signal; and in parallel driving an external load with a high voltage output from said output driver.

Also in accordance with the objects of this invention, a circuit, capable of driving higher loads for higher voltages and higher currents with slew rate controlled output signals is achieved. Said circuit comprises means for transforming a high voltage input signal in relation to a static high supply voltage level into a proportional current signal. Also comprised in said circuit are means for mirroring said resulting current input signal into a current output signal and means for generating a low voltage output signal representing said current output signal. Further realizes said circuit means for performing differentiation transactions upon said low voltage output signal, in relation to given time steps and means for converting said low voltage differentiated output signal into a digital bit signal by using a comparator. Said circuit then includes means for feeding said bit signal into a digital regulator part as input and generate an output signal. Still further comprised are means for feeding said output signal from said digital regulator as input to a digital-to-analog converter and generate an analog output. Said analog output feeds the input of the output driver circuit and means for closing a regulator loop with said output signal from said output driver by feeding it back into said high voltage input signal and finally means for driving an external load with said high voltage output from said output driver.

BRIEF DESCRIPTION OF THE DRAWINGS

In the accompanying drawings forming a material part of this description, the details of the invention are shown.

DESCRIPTION OF THE PREFERRED EMBODIMENTS

The preferred embodiments disclose a novel circuit for a high-voltage output driver for a variable voltage range and variable output load and a method of controlling the slew rate of the feedback signal within the regulator loop.

The description of the preferred embodiments of the invention is subdivided in two steps; firstly an overall description of the whole circuit and a short explanation of every functional circuit block are given and secondly a more detailed description of the crucial circuit block, wherein the separation of the voltage domains takes place, is following.

Figure 1:
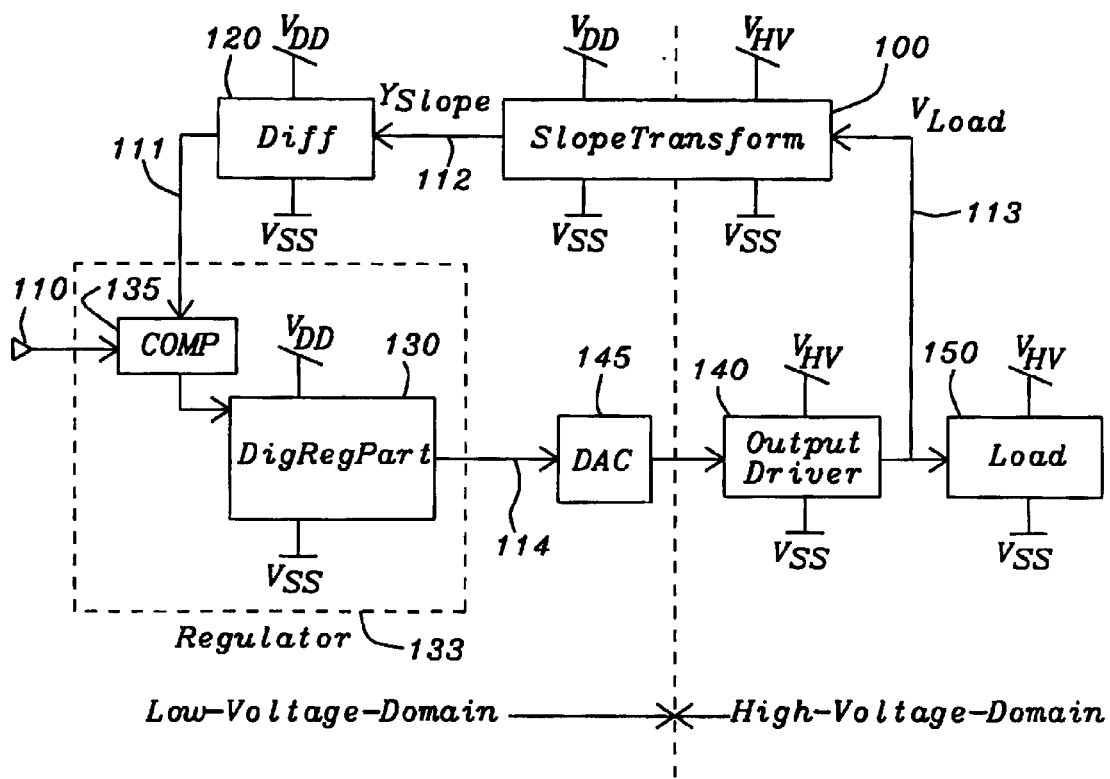
FIG. 1 illustrates the building blocks for the preferred embodiment of the present invention i.e. the block diagram of the slew rate control loop of the driver. The block diagram shows six essential circuit blocks realizable with modern monolithic integrated-circuit technologies.

Referring now to FIG. 1, the preferred embodiment of the circuit of the present invention is illustrated. The five essential functional components of the circuit according to the invention are shown in FIG. 1 in the form of a block diagram. This diagram incorporates a slope transformer circuit block 100 named "SlopeTransform", a differentiator block 120, named "Diff", a regulator named "Reg" with the sub-blocks comparator named "COMP" 135 as front-end part of the regulator and the digital regulator part 130, named "DigRegPart", in a whole designated as Regulator 133, a digital-to-analog converter 145 named "DAC" and an output driver circuit 140, named "OutputDriver"; altogether connected in a closed regulator loop. The output signal of that loop, now then furnished by the "OutputDriver" is feeding the external load block 150, generalized as "Load". This "Load" may represent further electronical circuits and/or electromechanical devices. The output signal of said "OutputDriver" block and, at the same time, the input signal into said block "SlopeTransform" on line 113 is called $V_{Load}$, the output signal from said block "SlopeTransform" on line 112 is called $V_{Slope}$.

An external control signal is fed into this regulator loop at pin 110 of the block "COMP", thus serving as the reference value for "Reg". Said reference signal can be a single analogue level or multi-signals for defining level windows.

The voltages for powering said circuit blocks come from two possible potential ranges, namely a low voltage $V_{DD}$, usually maximal as 5 V (common supply voltage ranges for CMOS circuits), and a high voltage $V_{HV}$,—starting with ranges higher than 5 V and up to for example of 24 V as normal operating range and maximum of up to for example of 40V without destruction. The voltage indication $V_{SS}$ signifies ground potential.

The differentiator block "DIFF"—item 120—and the block "Regulator"—item 133—as well as the digital-to-analog converter block "DAC"—item 145—are supplied solely from low voltage $V_{DD}$ sources. The blocks "OutputDriver"—item 140—and "Load"—item 150—are supplied with high voltage levels $V_{HV}$ only. The block "SlopeTransform"—item 100—however is supplied by both voltages, $V_{DD}$ and $V_{HV}$, thus the physical separation of these two voltage ranges has to be realized within that circuit block. The separating line for the two voltage domains is clearly shown as dashed line in FIG. 1.

Figure 2A:
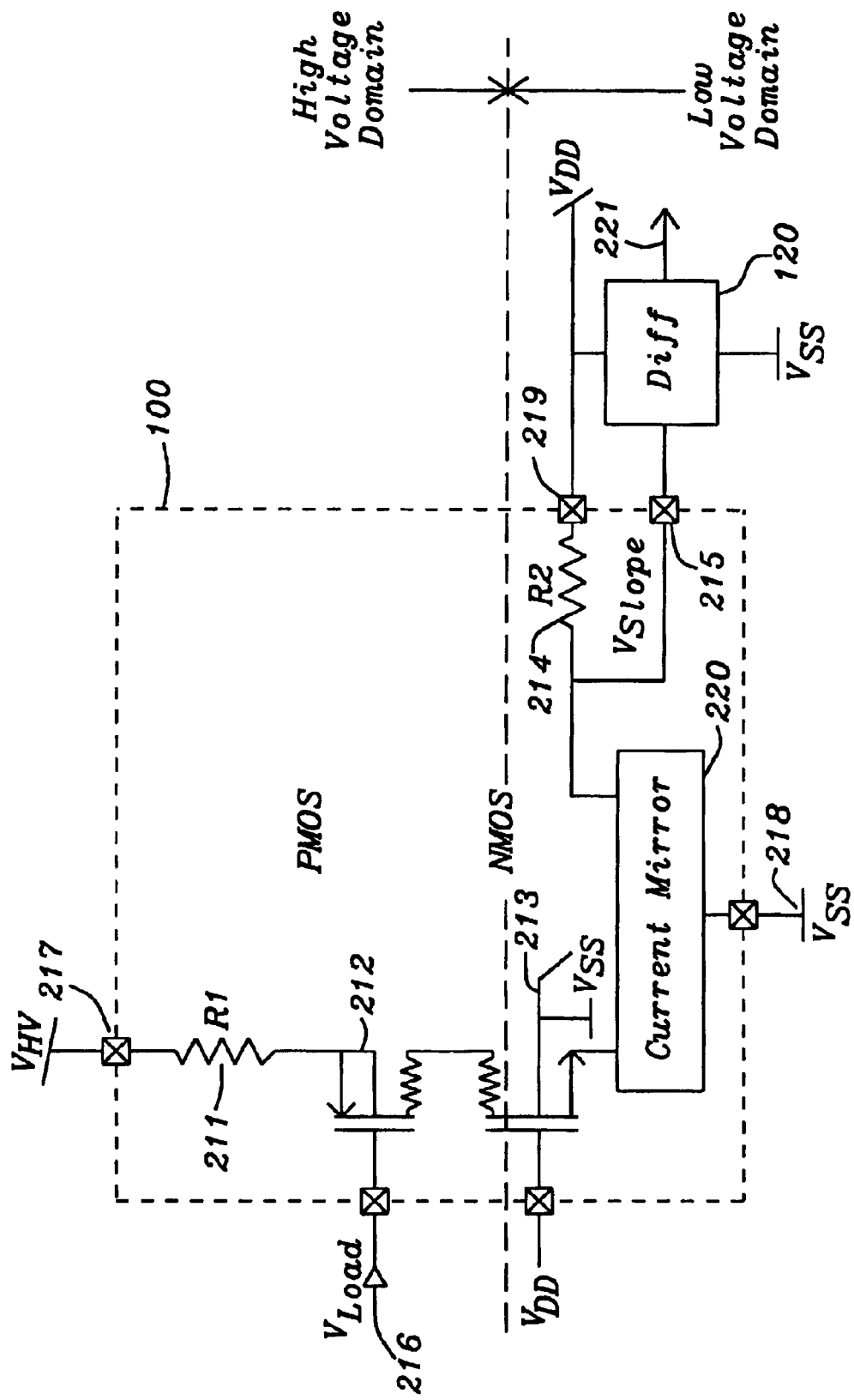
FIG. 2a shows the electrical circuit diagram of the gain stage within the essential building block named slope transformer circuit and an extra block for a current mirror, internal to said slope transformer circuit together with the essential differentiator block, both as shown in FIG. 1.

Referring to FIG. 2a, the slope transformer circuit block—item 100 from FIG. 1—called "SlopeTransform", which also serves as the aforementioned voltage domain separator is now explained in more detail. The need for a slope transformer circuit as such, especially in conjunction with bus driver circuits stems from the already explained wishes for an EMI reduction. Slope smoothing in fact reduces effectively parasitic high frequency components. On the other hand too slowly rising and/or falling slopes would restrict the dynamical behavior or the maximal communication speed. Therefore a specified slew rate (as Min/Max-tolerance e.g.) for the slope is defined and thus makes some extra hardware slope controller circuitry necessary. The dashed box in FIG. 2a outlines the "SlopeTransform" block. It owns five connectors: a slope signal input pin—item 216—connected to high voltage line 113 in FIG. 1; a slope signal output pin —item 215—connected to low voltage line 112 in FIG. 1; a high voltage supply pin—item 217; a low voltage supply pin—item 219; and at last a ground pin—item 218. Said high voltage supply pin is connected to resistor $R_1$—item 211—which itself leads to the source of a first MOS transistor in p-channel technology, PMOS—item 212. The gate of said PMOS transistor is driven with the slope input signal from pin 216. The drain of said PMOS transistor (implemented with an extended drain design) is in turn connected with the drain of a second MOS transistor in n-channel technology, NMOS—item 213. Thus transistor PMOS 212 is working in a source follower configuration. Said drain of said NMOS transistor is equally implemented with an extended drain design. This NMOS transistor is used for decoupling the high voltage domain from the low voltage domain as described later on. The gate of the NMOS transistor is statically biased to such a level that its source always stays within the low voltage domain $V_{DD}$. Usually the gate of the NMOS transistor could therefore be as easiest directly derived from the voltage level of $V_{DD}$. The source of said NMOS transistor is now feeding its current into the input terminal of a current mirror circuit block—item 220, as can be seen from FIG. 2a. The mirrored output current from said current mirror serves now as entry to resistor $R_2$—item 214; which is connected with pin 219 to said low supply voltage $V_{DD}$—and via pin 215 to said differentiator circuit block "Diff"—item 120—also shown in FIG. 1. An operation breakdown has to emphasize firstly, that resistor $R_1$, fed by $V_{HV}$, serves as a high voltage to current translator, transforming the input signal $V_{Load}$. Continuing secondly, said current mirror transposes this current to another current, hereto proportional. Finishing thirdly, the resistor $R_2$, fed by $V_{DD}$ and said proportional current, translates said current back into the low signal voltage $V_{Slope}$, thus serving as a current to low voltage translator.

Recalling FIG. 1 again, an important second aspect of the invention shall now be explicitly described. Having now available in the low voltage domain said signal $V_{Slope}$, it is self-evident, that the absolute values of said signal $V_{Slope}$ are basically and essentially determined by these two consecutive translation steps, namely said voltage to current to voltage translation. Thus any changes in the governing parameters for these translation would influence directly the absolute value of signal $V_{Slope}$, resulting in a high sensitivity of the regulator characteristics to these changes. Especially detrimental would be the variations of the high supply voltage $V_{HV}$, which are usually very significant in practice. An important part of the invention is therefore the use of said differentiator block 120, named "Diff", wherein the slope signal is evaluated as a differential voltage signal $\Delta V_{Slope}$, related to a certain, given time step $\Delta t$. The resulting transformation ratio $TR=\Delta V_{Load}/\Delta V_{Slope}$ can then be calculated as $TR=(R_2/R_1)^* A_{CM}$, whereby $A_{CM}$ is the aspect ratio of the current mirror components. As key point of the invention shall be recognized, that this transformation ratio TR of the slope transformer evaluated by the differentiator does not depend on any absolute voltage values, which primarily allows for the high to low voltage domain transfer of the slew rate detector circuitry operating at high-voltage domain and its reduced complexity. The implementation of the difference function is realized as a switched capacitor circuit, the necessary clock generator also determining said time step $\Delta t$. The following comparison function is also preferably realized with a time step $\Delta t$ relation, i.e. by a clocked comparator, resulting in a digital bit signal further processed by a regulator circuit block "DigRegPart" 130. The regulator's digital part "DigRegPart" can then be implemented e.g. as a counter, only incrementing or decrementing for respectively rising or falling edge signals. This means only a single polarity function is necessary for each edge polarity and therefore an increased regulator loop stability is achieved. Depending on the implementation of the comparator i.e. single bitstream, multi-bit window etc. various digital part realization concepts may improve the regulator accuracy and stability i.e. coarse and fine range definition with a window comparator output or integrator function on a single-bitstream comparator output. Adaptive regulator concepts are also an especially good solution where the external load conditions of the driver are stable over longer periods and the load is also defined only in a specified range.

It should be pointed out, that these transactions could in principle be realized also with analogue signals and circuits; here we assumed however digital signals—for a digital comparator and regulator. Another regulator implementation could be realized also with pure analogue circuits. The principle of the complete regulation loop keeps unchanged as described within FIG. 1. The change would only be the realization of the regulator block "Reg" as an analogue circuit with an analogue output and then avoiding the "DAC" component. The analogue regulator output feeds then directly the driver input.

Figure 2B:
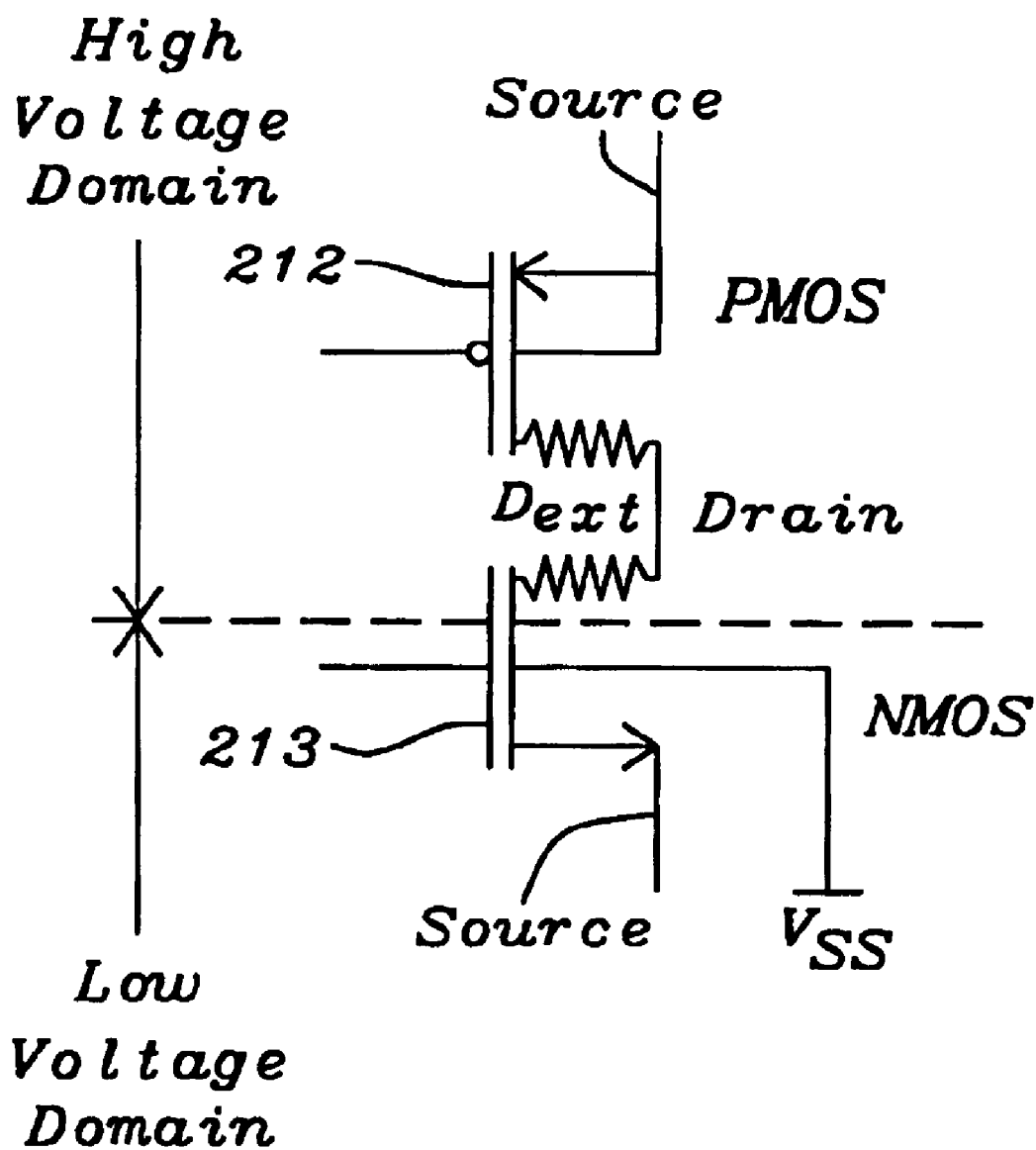
FIG. 2b shows the crucial part of the electrical circuit diagram of FIG. 2a for separating the high-voltage and low-voltage domains in more details.

Looking now at FIG. 2b, the voltage domain separation, realized with said two transistors, PMOS and NMOS is further explained. The high voltage isolation, barrier is built with the special drains $D_{ext}$, manufactured as extended drain designs of said transistors. Extended drain design for CMOS transistors signifies in that context, that the common, for source and drain substantially symmetrical layout of CMOS devices, fabricated with a standard CMOS process, is modified in such a way, that now between gate and drain an extra space, covered with additional field oxide is introduced. This type of transistor therefore is now substantially unsymmetrical. For this reason the breakthrough voltage for VGD is raised to e.g. about 40 V, a CMOS process feature size down to 0.35 μm presumed. In turn the breakthrough voltage for VDS is also elevated to e.g. about 40 V. These are values currently achievable by semiconductor foundries; it may be noted, that these values are strongly depending on the CMOS feature size. It is evident, that the extra masks and fabrication steps for extended drain devices are influencing the cost of production.

The $V_{Bias}$ level can be selected as $V_{DD}$, the supply level of the low voltage domain, as the NMOS high-voltage device is only used in order to decouple the high-voltage from the low-voltage domain, The stage, realized with said two transistors, PMOS and NMOS is now further explained.

Figure 3:
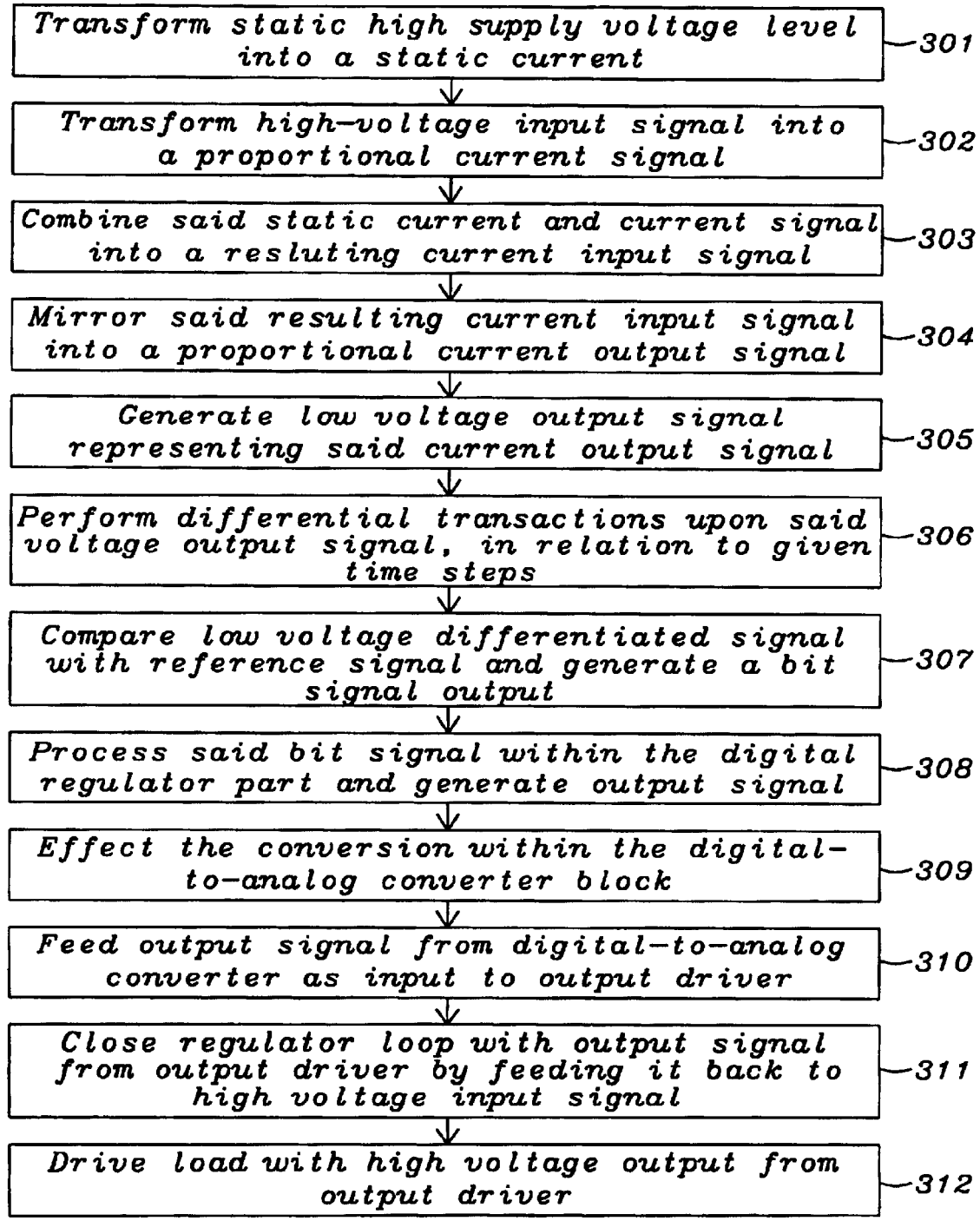
FIG. 3 illustrates the method how to put into practice the slew rate control with the circuit of the invention.

FIG. 3 illustrates the method how to realize the stable and insensitive—especially against supply voltage variations—high-voltage front-end for the output driver with the circuit of the invention, as described and explained before.

As a first step 301 is described, that the static high supply voltage level is transformed into a static current. With step 302, the high-voltage input signal is transformed into a proportional current signal. Step 303 combines said static current and current signal into a resulting current input signal. In step 304 said resulting current input signal is mirrored into a proportional current output signal. Step 305 generates a low voltage output signal representing said current output signal. Within step 306 the necessary differential transactions upon said low voltage output signal are performed, each with relation to the given time steps. Step 307 compares the low voltage differentiated signal with a reference input and generates a bit type signal output. In step 308 said bit signal is fed into the digital regulator part as Input and further processed. Step 309 converts the digital regulator part output into an analogue signal. In step 310 said output signal from the analog-to-digital converter is fed as input to the output driver circuit. Step 311 closes the regulator loop with said output signal from the output driver by feeding it back into the high voltage input signal. Finally step 312 drives the external load with the high voltage output from the output driver.

As shown in the preferred embodiments and evaluated by circuit analysis, the novel circuits and methods provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method for realizing a stable high-voltage front-end for an output driver circuit, insensitive against supply voltage variations, comprising:
   providing a slope transformer circuit, a differentiator with clock, a regulator with clocked comparator and digital regulator part, and the output driver circuit driving an external load;
   transforming a static high supply voltage level into a static current;
   transforming a high-voltage input signal into a proportional current signal;
   combining said static current and proportional current signal into a resulting current input signal;
   mirroring said resulting current input signal into a proportional current output signal;
   generating a low voltage output signal representing said current output signal;
   performing differential transactions upon said low voltage output signal, in relation to given time steps from a clock generator;
   converting a low voltage differentiated output signal into a digital bit signal by a comparator using a given time step related reference;
   feeding said bit signal into a digital regulator part for further processing generate an digital output signal;
   convert said digital output signal into an analog signal as input to the output driver circuit;
   closing a regulator loop with an output signal from the output driver by feeding it back into a high voltage input signal; and
   driving a load with a high voltage output from the output driver.

2. The method according to claim 1 wherein said step of transforming a static high supply voltage level into a static current is implemented using a resistor.

3. The method according to claim 1 wherein said step of transforming a static high voltage supply level into a static current is implemented using an equivalent resistor circuit built of semiconductor circuits.

4. The method according to claim 1 wherein said step of transforming the high-voltage input signal into the proportional current signal is implemented using a PMOS transistor, configured as a source follower working together with an NMOS transistor, for decoupling the current mirror stage.

5. The method according to claim 1 wherein said step of transforming the high-voltage input signal into the proportional current signal is implemented using a PMOS transistor with extended drain, configured as a source follower working together with an NMOS transistor, for decoupling the current mirror stage.

6. The method according to claim 1 wherein said step of transforming the high-voltage input signal into the proportional current signal is implemented using a PMOS transistor, configured as a source follower working together with an NMOS transistor with extended drain, for decoupling the current mirror stage.

7. The method according to claim 1 wherein said step of transforming the high-voltage input signal into the proportional current signal is implemented using a PMOS transistor with extended drain, configured as a source follower working together with an NMOS transistor with extended drain, for decoupling the current mirror stage.

8. The method according to claim 1 wherein said step of mirroring said resulting current input signal into the proportional current output signal is realized using a current mirror circuit.

9. The method according to claim 1 wherein said step of generating the low voltage output signal representing said current output signal is realized using a resistor.

10. The method according to claim 1 wherein said step of generating the low voltage output signal representing said current output signal is implemented using an equivalent resistor circuit built of semiconductor circuits.

11. A circuit, capable of driving higher loads for higher voltages and higher currents with slew rate controlled output signals, comprising:
   means for transforming a static high voltage supply level into a static current;
   means for transforming a dynamic high voltage input signal into a proportional current signal;
   means for combining said static current and said proportional current signal into a resulting current input signal;
   means for mirroring said resulting current input signal into a current output signal;

means for generating a low voltage output signal representing said current output signal;

performing differential transactions upon said low voltage output is signal, in relation to given time steps from a clock generator, converting a low voltage differentiated output signal into a digital bit signal by a comparator using a given time step related reference;

feeding said bit signal into a digital regulator part for further processing and generate a digital output signal;

convert said digital output signal into an analogue signal as input to an output driver circuit;

means for driving an external load with a high voltage output from said output driver.

12. The circuit according to claim 11 wherein said means for transforming the static high voltage supply level into the static current is a resistor.

13. The circuit according to claim 11 wherein said means for transforming the static high voltage supply level into the static current is an equivalent resistor circuit built of semiconductor circuits.

14. The circuit according to claim 11 wherein said means for transforming the dynamic high voltage input signal into the proportional current signal is a resistor.

15. The circuit according to claim 11 wherein said means for transforming the dynamic high voltage input signal into the proportional current signal is an equivalent resistor circuit built of semiconductor circuits.

16. The circuit according to claim 11 manufactured with the help of discrete active and passive components.

17. The circuit according to claim 11 manufactured with the help of discrete components and integrated circuits.

18. The circuit according to claim 11 manufactured in integrated circuit technology.

19. The circuit according to claim 11 manufactured in monolithic integrated circuit technology.

20. The circuit according to claim 11, manufactured in monolithic integrated CMOS technology.

21. The circuit according to claim 11, manufactured in monolithic integrated CMOS circuit technology with additional discrete PMOS and NMOS transistors.

22. The circuit according to claim 11, manufactured in monolithic integrated CMOS circuit technology with additional discrete PMOS and NMOS transistors with extended drain technology.

23. The circuit according to claim 11, manufactured in monolithic integrated CMOS technology with additional PMOS and NMOS transistors, assembled in Chip-On-Chip technology.

24. The circuit according to claim 11, manufactured in monolithic integrated CMOS technology with additional PMOS and NMOS transistors with extended drain technology, assembled in Chip-On-Chip technology.

25. The circuit according to claim 11, wherein said means for performing differential transactions upon said low voltage output signal, in relation to given time steps from the clock generator is realized in integrated low-voltage CMOS technology.

26. The circuit according to claim 11, wherein said means for converting the low voltage differentiated output signal into the digital bit signal by the comparator using a given time step related reference is realized in integrated low-voltage CMOS technology.

27. The circuit according to claim 11, wherein said means for feeding said bit signal into the digital regulator part for further processing and generate the digital output signal is realized in integrated low-voltage CMOS technology.

28. The circuit according to claim 11 wherein said means for mirroring said resulting current input signal into a current output signal is set up using the current mirror.

29. The circuit according to claim 28 wherein said current mirror circuit is implemented in integrated circuit technology.

30. The circuit according to claim 28, wherein said current mirror circuit is realized in integrated CMOS technology.

31. The circuit according to claim 28, wherein said current mirror circuit is realized in low-voltage CMOS technology.

* * * * *